United States Patent [19]
Cho et al.

[11] Patent Number: 5,629,894
[45] Date of Patent: May 13, 1997

[54] MEMORY MODULE HAVING READ-MODIFY-WRITE FUNCTION

[75] Inventors: Soo-In Cho, Seoul; Dong-Il Seo; Seung-Moon Yoo, both of Suwon, all of Rep. of Korea

[73] Assignee: Samsung Electronics Co., Ltd., Suwon, Rep. of Korea

[21] Appl. No.: 563,407

[22] Filed: Nov. 30, 1995

[30] Foreign Application Priority Data

Nov. 30, 1994 [KR] Rep. of Korea ................ 32090/1994

[51] Int. Cl.⁶ .................................................. G11C 13/00
[52] U.S. Cl. ......................... 365/189.01; 365/189.03
[58] Field of Search ........................... 365/189.01, 51, 365/189.03, 202, 189.08

[56] References Cited

U.S. PATENT DOCUMENTS 4,694,428  9/1987  Matsumura ..................... 365/189.01

*Primary Examiner*—Terrell W. Fears
*Attorney, Agent, or Firm*—Cushman Darby & Cushman, IP Group of Pillsbury Madison & Sutro, LLP

[57] ABSTRACT

A memory module having parity and capable of performing a read-modify-write (RMW) operation is provided. The memory module has data input and output pins for processing a plurality of data bits and a parity bit and is comprised of one semiconductor memory device which processes the parity bit and a plurality of semiconductor memory devices which each process a plurality of data bits. All of the memory devices include at least one data input/output pin for receiving and supplying data and at least one control pin for receiving a control signal. The memory module according to the present invention is simply constructed so as to yield high integration in a semiconductor integrated circuit, and is capable of high-speed applications.

8 Claims, 2 Drawing Sheets

MEMORY MODULE HAVING READ-MODIFY-WRITE FUNCTION

BACKGROUND OF THE INVENTION

The present invention relates to a memory module composed of a plurality of semiconductor memory devices and, in particular, to a memory module having parity and capable of performing a read-modify-write (RMW) operation.

A technique for composing a memory module having parity, and providing external pins for controlling high-speed access of input and output data is disclosed in "DRAM Module Data Book", Vol. 1992/93, p 165, published by Samsung Electronics Co. Ltd.

FIG. 1 illustrates the construction of a prior art memory module, according to that disclosed in the above data book e.g., a 4Mx9 memory module 1 (wherein "x9" indicates the number (9) of bits constituting one word, the word being composed of 8 data bits and one parity bit, and "4M" indicates the capacity (4 Meg) of the module). As shown in FIG. 1, the memory module 1 includes two 4Mx4 semiconductor memory devices 3 and 5 and a single 4Mx1 semiconductor memory device 7. The 4Mx4 semiconductor memory devices 3 and 5 each have common data input and output pins DQ1~DQ4 and the 4Mx1 semiconductor memory device 7 has a separate data input pin DIN and output pin DOUT. Data input and output pins DQ1~DQ4 of memory device 3 are coupled to data input and output pins DQM1~DQM4 of memory module 1 whereas data input and output pins DQ1~DQ4 of memory device 5 are coupled to data input and output pins DQM5~DQM9 of memory module 1. Further, data input pin DIN and data output pin DOUT of memory device 7 are joined together to data input and output pin DQM9 for processing the parity data of memory module 1. Meanwhile, the output enable signal pins $\overline{OE}$ of both 4Mx4 semiconductor memory devices 3 and 5 (supplying output enable signals to each device) are coupled to a ground potential Vss. Furthermore, each memory device 3, 5 and 7 contains pins to which address signals and control signals are applied (for example, row address strobe signal $\overline{RAS}$, column address strobe signal $\overline{CAS}$, write enable signal $\overline{WE}$, and so on). However, detailed descriptions of these signals are unnecessary and will be omitted.

In a memory module such as that of FIG. 1, the method of data input and output in a x4 semiconductor memory device is different from that of a x1 semiconductor memory device. Accordingly, the output enable signal pins $\overline{OE}$ of the 4Mx4 semiconductor memory devices 3 and 5 are coupled to ground potential Vss while data input pin DIN and data output pin DOUT of the 4Mx1 semiconductor memory device 7 are joined together in a unitary format. That is, each bit line of the x4 semiconductor memory device has a common data pin for both data input and output and each x4 device has a single data output enable signal pin for controlling the data input and output. In contrast, the x1 semiconductor memory device has a pin for both data input DIN and output DOUT, and no output enable signal pin.

Since the number of data lines typically required to interface the memory module with a CPU, for example, is nine (for an eight-bit word having one parity bit), the data input and output pins of the x1 semiconductor memory device in FIG. 1 must be commonly connected to pin DQM9. This is not a problem in most applications, such as when the CPU performs a standard read or write cycle. In such cases, the CPU prevents read operations from the memory module by driving its data output lines to a high-impedance state. Conversely, when output enable signal $\overline{OE}$ of the 4Mx4 semiconductor memory devices, is "low", the CPU reads or writes data from/to the memory module 1 according to timing controlled by row address strobe signal $\overline{RAS}$, column address strobe signal $\overline{CAS}$ and write enable signal $\overline{WE}$. However, due to the constraints of the design of a memory module such as that in FIG. 1, problems arise when the CPU selects a read-modify-write operation, as will be discussed below.

A technique for performing a read-modify-write operation during a single operation cycle of a memory module is well-known in the present field. In this technique, the write enable signal $\overline{WE}$ is dispensably activated, at least after as much time has passed as that needed for accessing the column address strobe signal $\overline{CAS}$. However, because it provides no way to selectively control input and output, the x1 semiconductor memory device of FIG. 1 cannot discriminate the read-modify-write cycle selected by the CPU from a general read and write cycle. More particularly, although the read-modify-write operation of 4Mx4 semiconductor memory devices 3 and 5 can be reliably controlled by the output enable signal provided to each pin $\overline{OE}$, in the 4Mx1 semiconductor memory device 7, a data conflict between the input data line and the output data line is created because they are joined to each other in the unitary format. Consequently, the parity bit of the conventional memory module of FIG. 1 is unable to perform the read-modify-write operation selected by the CPU.

SUMMARY OF THE INVENTION

It is therefore an object of the present invention to provide a memory module for performing a read-modify-write operation while including a semiconductor memory device for parity.

It is another object of the present invention to provide a memory module having an efficient interface with a CPU while having a parity bit.

These and other objects can be achieved according to the principles of the present invention with a word extended semiconductor memory module comprising a plurality of data input and output pins for processing a plurality of data bits including a parity bit.

According to one aspect of the present invention, the word extended semiconductor memory module is comprised of one semiconductor memory device which processes the parity bit and a plurality of semiconductor memory devices which each process a plurality of data bits. All of the memory devices include at least one data input/output pin for receiving and supplying data and at least one control pin for receiving a control signal.

According to another aspect in keeping with the principles of the present invention, the word extended semiconductor memory module is comprised of one semiconductor memory device which processes the parity bit and a plurality of semiconductor memory devices which each process a plurality of data bits. All of the memory devices for processing data include at least one data input/output pin for receiving and supplying data and at least one control pin for receiving a control signal. The parity memory device includes separate input and output pins for the parity data, and are joined together in a unitary format. The parity memory device also has a pin for receiving a control signal.

BRIEF DESCRIPTION OF THE DRAWINGS

A more complete appreciation of this invention, and many of the attendant advantages thereof, will become readily apparent with reference to the following detailed description considered in conjunction with the accompanying drawings, in which like reference symbols indicate the same or similar elements, wherein.

DETAILED DESCRIPTION OF THE PREFERRED EMBODIMENTS

In the following description, although a memory module such as the well-known single in-line memory module (SIMM) is illustrated and described according to the present invention, it will be understood by those skilled in the art that various changes and modifications may be made, and equivalents may be substituted for elements thereof without departing from the true scope of the present invention.

Figure 1:
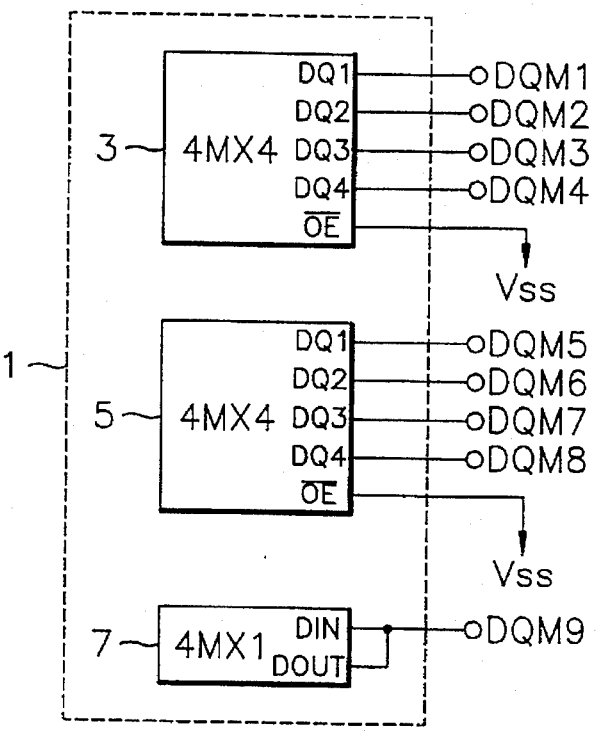
FIG. 1 is a diagram illustrating the construction of a prior art memory module.
Figure 2:
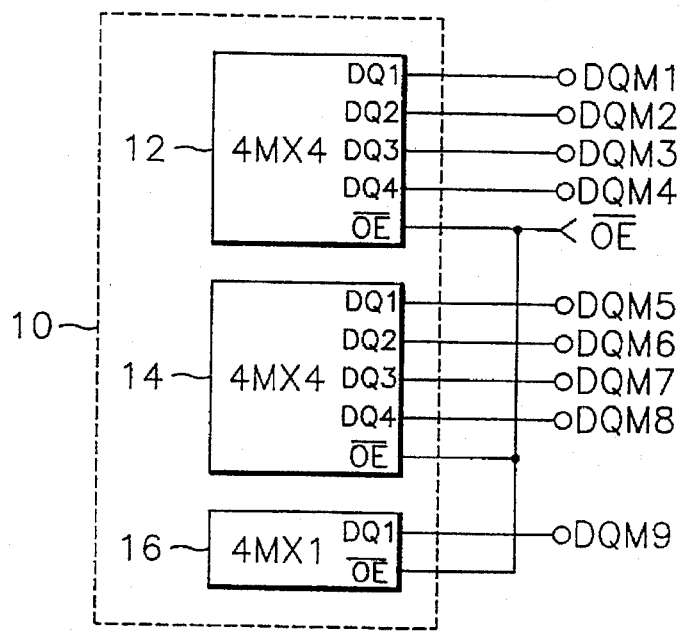
FIG. 2 is a diagram illustrating a first embodiment of the memory module constructed according to the principles of the present invention.

FIG. 2 illustrates a first embodiment of a memory module 10 constructed according to the principles of the present invention. The memory module 10 of FIG. 2, as shown in FIG. 1, is composed of two 4Mx4 semiconductor memory devices 12 and 14 and one 4Mx1 semiconductor memory device 16. Data input and output pins DQ1~DQ4 of the 4Mx4 semiconductor memory device 12 are coupled to data input and output pins DQM1~DQM4 of memory module 10 and data input and output pins DQM1~DQM4 of the 4Mx4 semiconductor memory device 14 are coupled to data input and output pins DQM5~DQM8 of memory module 10. Also, data input and output pin DQ1 of the 4Mx1 semiconductor memory device 16 for parity is coupled to data input and output pin DQM9 of memory module 10. Memory module 10, according to the principles of the present invention, unlike the memory module of FIG. 1 described above, includes output enable signal pins $\overline{OE}$ on each of the semiconductor memory devices including 4Mx1 semiconductor memory device 16, to which the output enable signal $\overline{OE}$ is applied.

Figure 3:
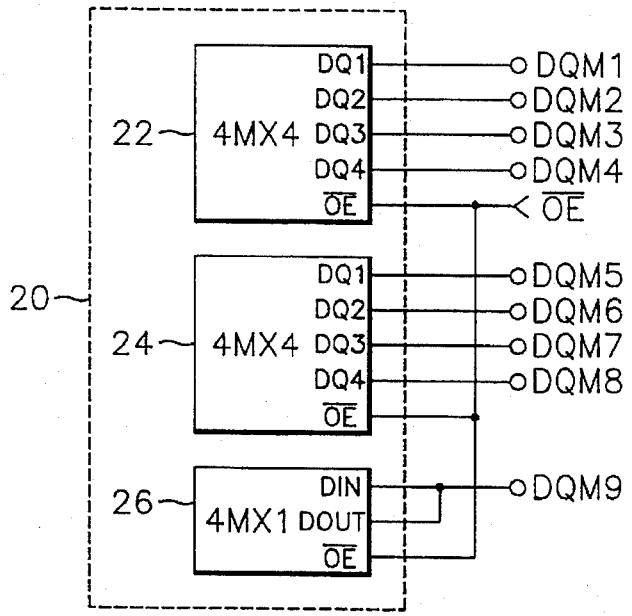
FIG. 3 is a diagram illustrating a second embodiment of the memory module constructed according to the principles of the present invention.

FIG. 3 illustrates a second embodiment of the memory module 20 constructed according to the principles of the present invention, in which a 4Mx1 semiconductor memory device 26 for parity bit has, separately, a data input pin DIN and a data output pin DOUT, as shown in FIG. 1. The construction of FIG. 3 is the same as that of FIG. 2 except for the pin format of the 4Mx1 semiconductor memory device 26. The data input pin DIN and the data output pin DOUT of the 4Mx1 semiconductor memory device 26 are joined together and coupled to a parity data input and output pin DQM9 of the memory module 20. As before, data input and output pins DQ1~DQ4 of 4Mx4 semiconductor memory device 22 are coupled to data input and output pins DQ1~DQ4 of memory module 20 and data input and output pins DQ1~DQ4 of 4Mx4 semiconductor memory device 24 are coupled to data input and output pins DQM5~DQM8 of memory module 20. As shown in FIG. 2, there are respective pins for output enable signals $\overline{OE}$ in each of the semiconductor memory devices 22, 24, and 26. Thereby, the output enable signal $\overline{OE}$ is applied to the devices.

Even though not shown in FIGS. 2 and 3, it is understood that pins for a row address strobe signal $\overline{RAS}$, column address strobe signal $\overline{CAS}$, write enable signal $\overline{WE}$, and a plurality of address signals exist in each of the semiconductor memory devices. As is known in the art, these signals are necessary to operate the semiconductor memory device.

Figure 4:
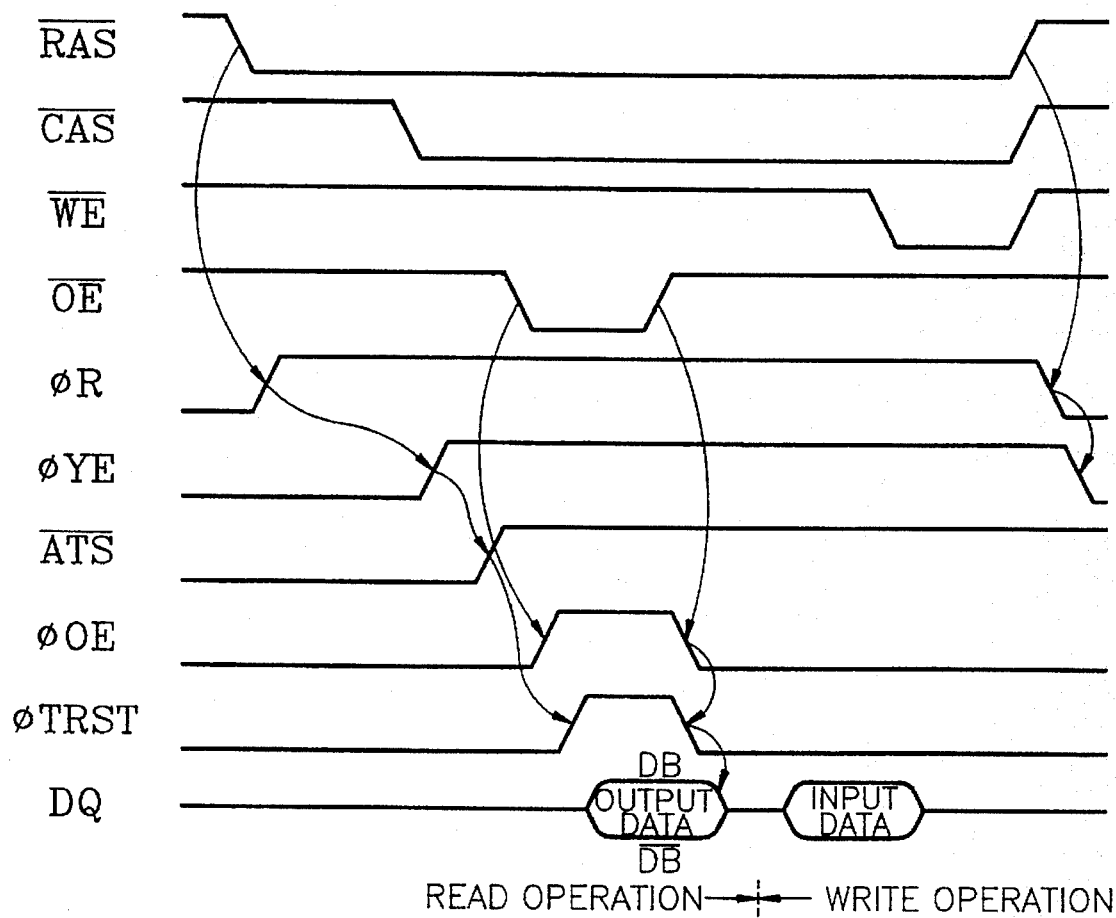
FIG. 4 is a timing diagram illustrating an operation of each signal in the memory module according to the principles of the present invention.

FIG. 4 is a timing diagram illustrating an operation of each signal in the memory module 20 according to the principles of the present invention. In FIG. 4, when a master clock $\phi R$ is activated by transition of the row address strobe signal $\overline{RAS}$, a word line is selected. After the activation of a signal $\phi YE$ for column selection, a signal $\overline{ATS}$, responding to the transition of the column address, is activated to a high level. With the activation of the signal $\overline{ATS}$, a signal $\phi TRST$ for controlling the data output drive is activated, thereby developing a pair of data lines DB and $\overline{DB}$ and outputting one data bit through a data input and output pin DQ. As the output enable signal $\overline{OE}$ is inactivated to the high level, the signal $\phi OE$ is deactivated, by which the data output drive control signal $\phi TRST$ is deactivated. Thus, because the data output drive is in a high impedance state, the data input and output pin DQ is in a tri-state and the read operation is completed. Finally, the CPU performs the write operation by activating the write enable signal $\overline{WE}$.

FIGS. 2 and 3 show the embodiments of a 4Mx9 memory module composed of two 4Mx4 semiconductor memory devices for cell data processing and a 4Mx1 semiconductor memory device for parity. For high integration in the semiconductor integrated circuit, it is easily understood that the present invention can be embodied in memory modules comprising more bits per word and having more capacity.

As apparent from the foregoing, the memory module of the semiconductor integrated circuit according to the principles of the present invention is simply constructed with a single semiconductor memory device for parity, thereby capably performing the read-modify-write operation. The resulting device has the advantage that an operation mode of the semiconductor integrated circuit having a parity cell array can be easily and readily extended to perform a read-modify-write operation and the interface efficiency with the central processing unit can be increased.

While the present invention has been herein described with reference to the preferred embodiments, it will be appreciated that these are merely for purposes of example, and that the invention, or various aspects of the invention, may be advantageously used with other modifications or in other applications, without departing from the spirit and scope of the invention.

What is claimed is:

1. A memory module for storing a plurality of words containing a plurality of data bits and at least one parity bit, comprising:

a plurality of data input/output pins;

at least one parity data input/output pin;

a plurality of data control pins;

at least one parity data control pin;

a first semiconductor memory device for storing said parity bit, said first semiconductor memory device receiving and outputting parity data through said parity data input/output pin and receiving a parity data control signal through said at least one parity data control pin; and a plurality of second semiconductor memory devices for storing said data bits, each of said second semiconductor memory devices receiving and outputting data through at least one respective one of said plurality of data input/output pins and receiving a data control signal through at least one respective one of said plurality of data control pins.

2. The memory module according to claim 1, wherein each of said first and second semiconductor memory devices inputs a row address strobe signal, a column address strobe signal, a write enable signal and a plurality of address signals.

3. The memory module according to claim 2, wherein said parity data control signal and said data control signal are an output enable signal which is activated when said row address strobe signal and said column address strobe signal are activated.

4. A memory module, comprising:

a plurality of external data input/output pins;

at least one external parity data input/output pin;

a plurality of external data control pins;

at least one external parity data control pin;

a first semiconductor memory device for storing parity data, including
- a parity data input pin for receiving parity data,
- a parity data output pin for outputting parity data, said parity data input pin and said parity data output pin being jointly coupled to said at least one external parity data input/output pin, and
- a parity data control pin for receiving a parity data control signal, said parity data control pin being coupled to said at least one external parity data control pin; and a plurality of second semiconductor memory devices for storing cell data, each including
- a plurality of data input/output pins for receiving and outputting cell data, each of said data input/output pins being coupled to a respective one of said plurality of external data input/output pins, and
- a data control pin for receiving a data control signal, said data control pin being coupled to a respective one of said plurality of external data control pins.

5. The memory module according to claim 4, wherein said first semiconductor memory device is a single-bit semiconductor memory device and wherein said plurality of second semiconductor memory devices are each multi-bit semiconductor memory devices.

6. The memory module according to claim 5, wherein each of said single-bit and multi-bit semiconductor memory devices inputs a row address strobe signal, a column address strobe signal, a write enable signal and a plurality of address signals.

7. The memory module according to claim 6, wherein said parity data control signal and said data control signal are an output enable signal which is activated when said row address strobe signal and said column address strobe signal are activated.

8. A memory module for providing data storage for an external processor, comprising:

a multi-bit memory cell array for selectably storing and providing a plurality of data bits; and a single-bit memory cell array for selectably storing and providing a parity bit;

wherein a word includes
- a plurality of data bits selected from said multi-bit memory cell array, and
- a parity bit selected from said single-bit memory cell array, said word being read, modified and written by said external data processor in one operating cycle of said memory module.

* * * * *